(12) United States Patent
Park et al.

(10) Patent No.: US 7,803,517 B2
(45) Date of Patent: Sep. 28, 2010

(54) METHOD OF FORMING FINE CONTACT HOLE AND METHOD OF FABRICATING SEMICONDUCTOR DEVICE USING BLOCK COPOLYMERS

(75) Inventors: Sung-chan Park, Seoul (KR); Chang-jin Kang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 919 days.

(21) Appl. No.: 11/590,663

(22) Filed: Oct. 31, 2006

(65) Prior Publication Data

US 2008/0085601 A1    Apr. 10, 2008

(30) Foreign Application Priority Data

Sep. 27, 2006  (KR) ............... 10-2006-0094329

(51) Int. Cl.
*G03F 1/00* (2006.01)
*B28B 19/00* (2006.01)

(52) U.S. Cl. ............... 430/313; 430/320; 430/314; 430/317; 427/97.2; 438/637

(58) Field of Classification Search ............... None
See application file for complete search history.

(56) References Cited

U.S. PATENT DOCUMENTS 7,253,099 B2 *   8/2007   Hwang et al. ............... 438/637

2004/0175628 A1 *  9/2004  Nealey et al. ............... 430/1
2006/0166437 A1 *  7/2006  Korber ............... 438/257
2007/0176253 A1 *  8/2007  Wang et al. ............... 257/506

FOREIGN PATENT DOCUMENTS

| KR | 20000001567 | 1/2000 |
|---|---|---|
| KR | 20030042496 | 6/2003 |
| KR | 20040081865 | 9/2004 |

OTHER PUBLICATIONS

English Abstract of Publication No. 1020000001567.
English Abstract of Publication No. 1020030042496.
English Abstract of Publication No. 1020040081865.

* cited by examiner

*Primary Examiner*—Daborah Chacko Davis
(74) *Attorney, Agent, or Firm*—F. Chau & Associates, LLC

(57) ABSTRACT

A method of forming a contact hole includes forming a plurality of lower patterns on a substrate. An insulation layer is formed on the lower patterns. A self-assemble induction layer is formed on the insulation layer. A recess is formed in the self-assemble induction layer in alignment with the lower patterns. A block copolymer layer is formed in the recess to form a polymer domain at a distance from a sidewall of the recess and a polymer matrix surrounding the polymer domain. The polymer domain is removed. The self-assemble induction layer is etched using the polymer matrix as a mask to form an opening through the self-assemble induction layer to expose the insulation layer. The insulation layer exposed by the opening is etched using the self-assemble induction layer as a mask so as to form a contact hole.

19 Claims, 18 Drawing Sheets

HOMOGENOUS

PHASE-SEPARATED

METHOD OF FORMING FINE CONTACT HOLE AND METHOD OF FABRICATING SEMICONDUCTOR DEVICE USING BLOCK COPOLYMERS

CROSS-REFERENCE TO RELATED PATENT APPLICATION

This application claims the benefit of Korean Patent Application No. 10-2006-0094329, filed on Sep. 27, 2006, the disclosure of which is hereby incorporated by reference herein in its entirety.

BACKGROUND OF THE INVENTION

1. Technical Field

The present disclosure relates to a method of forming a fine contact hole in a semiconductor device, and more particularly, to a method of forming a fine contact hole in a semiconductor device and to a method of fabricating a semiconductor device using the method.

2. Description of the Related Art

Technologies for forming fine patterns are significant in connection with the manufacture of high-density integration of semiconductor devices. For example, to form more semiconductor devices in a given area, the size of each semiconductor device should be reduced.

As the design rule of semiconductor devices is significantly reduced, 50-nanometer (nm) or finer patterns should be formed. However, it is difficult to form 50-nm or finer patterns through a photolithograph process using an argon fluoride (ArF) light source. As a result, double patterning methods or photolithography technologies using an immersion method or a shorter-wavelength light source such as an extreme ultraviolet (EUV) source have been developed. However, these alternatives require very expensive equipment or increase process complexity, thereby also increasing manufacturing costs.

Therefore, alternative methods have been researched, including for example, a block copolymer method. A block copolymer is a copolymer made up of at least two covalently bonded polymer blocks. Moreover, free ends of the polymer blocks opposed opposing the covalently bonded ends are repulsive to each other, so that block copolymers can be self-assembled into a nanostructure. However, to use the nanostructure of the block copolymers in forming patterns of a semiconductor device, there is a need for a method of aligning a block copolymer nanostructure with other layers of a semiconductor device.

SUMMARY OF THE INVENTION

The present invention provides a method of forming a fine contact hole using block copolymers to align the contact hole with a lower pattern, and a method of fabricating a semiconductor device using the method.

In accordance with an exemplary embodiment of the present invention, a method of forming a contact hole is provided. The method includes forming a plurality of lower patterns on a substrate. An insulation layer is formed on the lower patterns. A self-assemble induction layer is formed on the insulation layer. A recess is formed in the self-assemble induction layer in alignment with the lower patterns. A block copolymer layer is formed in the recess to form a polymer domain at a distance from a sidewall of the recess and a polymer matrix surrounding the polymer domain. The polymer domain is removed. The self-assemble induction layer is etched using the polymer matrix as a mask to form an opening through the self-assemble induction layer to expose the insulation layer. The insulation layer exposed by the opening is etched using the self-assemble induction layer as a mask so as to form a contact hole.

In accordance with an exemplary embodiment of the present invention, a method of fabricating a semiconductor device is provided. The method includes forming a device isolation region on a substrate to define a plurality of parallel active regions. An insulation layer is formed on the active regions. A self-assemble induction layer is formed on the insulation layer. A recess is formed in the self-assemble induction layer. The recess is aligned with the active regions and crossing the active regions. A block copolymer layer is formed in the recess to form a plurality of polymer domains at a distance from a sidewall of the recess and a polymer matrix surrounding the polymer domains. The polymer domains are spaced apart from each other by the polymer matrix and aligned with the respective active regions over which the recess crosses. The polymer domains are removed. The self-assemble induction layer is etched using the polymer matrix as a mask to form a plurality of openings through the self-assemble induction layer to expose the insulation layer. The insulation layer exposed by the opening is etched using the self-assemble induction layer as a mask so as to form a plurality of contact holes.

BRIEF DESCRIPTION OF THE DRAWINGS

Exemplary embodiments of the present invention can be understood in more detail from the following description taken in conjunction with the attached drawings in which.

DETAILED DESCRIPTION OF THE EXEMPLARY EMBODIMENTS OF THE INVENTION

Figure 1A:
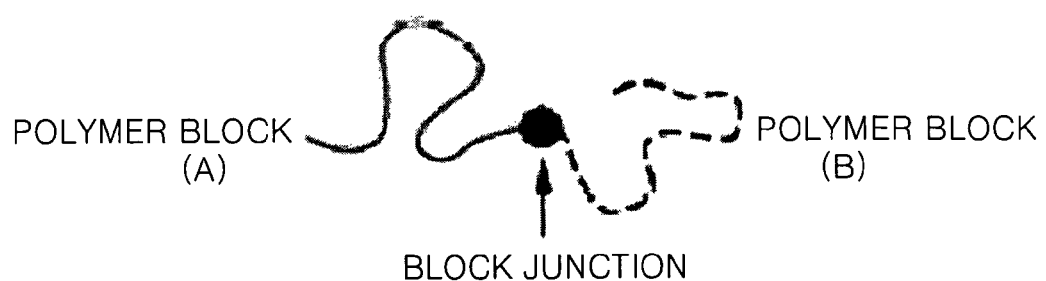
FIGS. 1A through 1C illustrate block copolymers that can be used in exemplary embodiments of the present invention.

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art. Like reference numerals in the drawings denote like elements.

FIG. 1A is a schematic view illustrating a block copolymer.

Referring to FIG. 1A, the block copolymer is a copolymer including at least two polymer blocks. Ends of the polymer blocks are covalently bonded, and the other ends repel each other. In a diblock copolymer (an example of the block copolymer), an end of a first polymer block (A) is covalently bonded to an end of a second polymer block (B), forming a block junction. The other ends of the first and second polymer blocks (A) and (B) repel each other.

Figure 1B:
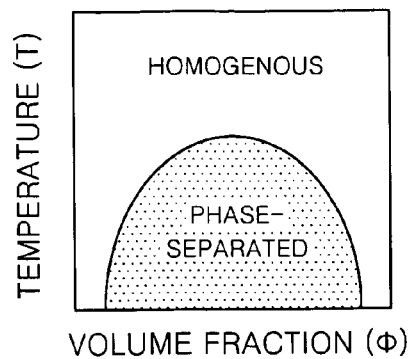
Figure 1B:
Figure 1B:
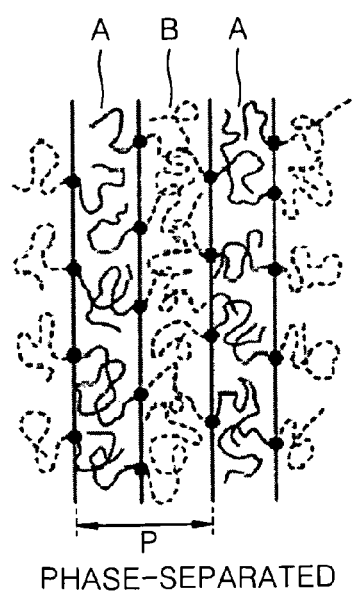

FIG. 1B is a phase diagram of copolymers with respect to temperature and volume fraction.

Referring to FIG. 1B, when the temperature (T) of copolymers decreases at a given volume fraction $\phi$, the copolymers changes from a homogeneous state where first and second polymer blocks (A) and (B) of the copolymers are randomly arranged into a microphase-separated state where the first and second polymer blocks (A) and (B) of the copolymers are self-assembled and separated into different domains. In the microphase-separated state, domains of the first polymer blocks (A) are arranged at a constant pitch (P). That is, the width of the first polymer block domains and the width of the second polymer block domains are respectively uniform. Here, the widths of the first and second polymer bock domains can be determined by molecular weights of the first and second polymer blocks (A) and (B).

Figure 1C:
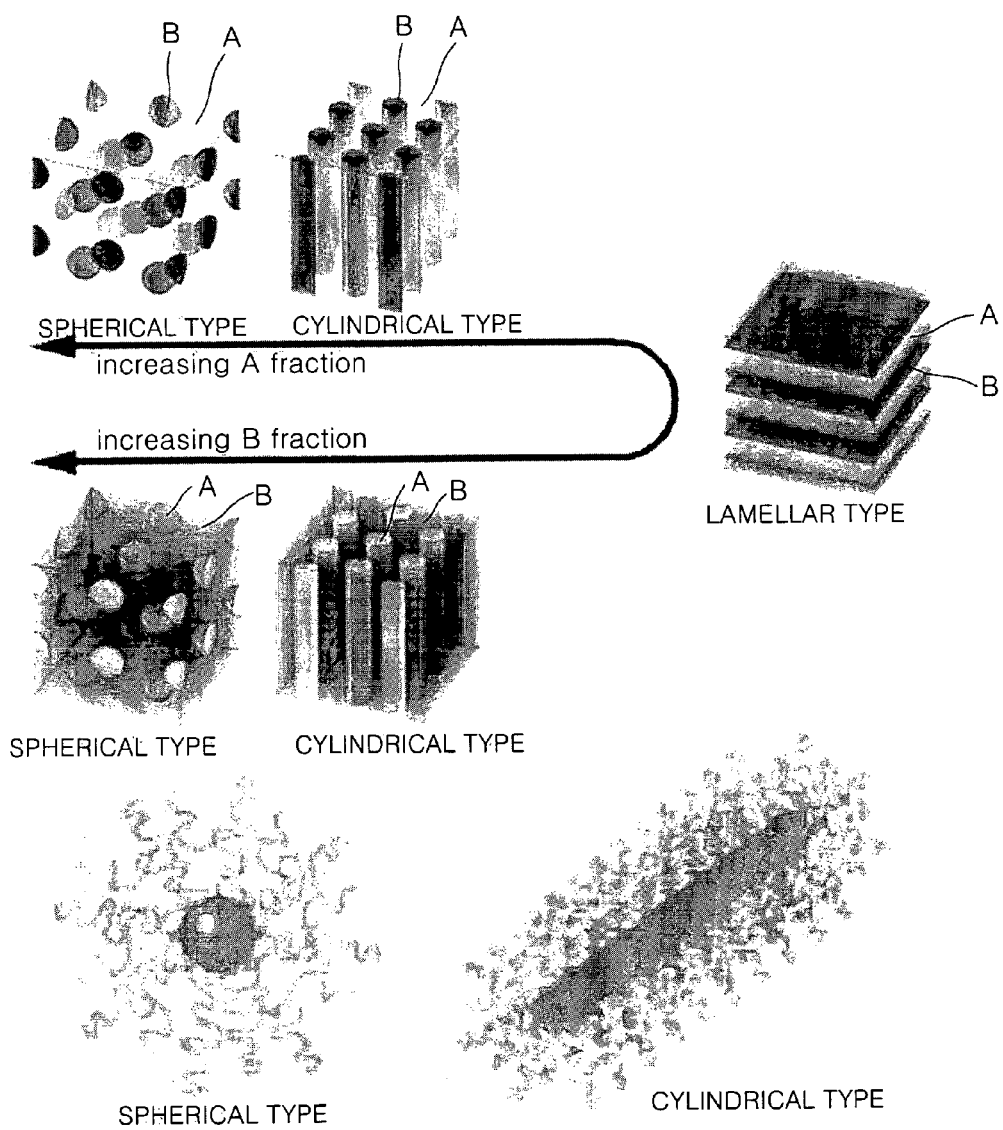

Referring to FIG. 1C, the shape of the polymer block domains varies with the volume fraction $\phi$. For example, when the first polymer blocks (A) have a volume fraction $\phi$ similar to that of the second polymer blocks (B), the first polymer block domains and the second polymer block domains are alternately stacked, forming a lamellar domain structure. When the volume fraction 4 of the second polymer blocks (B) increases, the first polymer blocks (A) are regularly arranged into a cylindrical domain array format, and the second polymer blocks (B) are formed between the cylindrical domains of the first polymer blocks (A) into a polymer matrix format. When the volume fraction $\phi$ of the second polymer blocks (B) increases much more, the first polymer blocks (A) are regularly arranged into a spherical domain array format, and the second polymer blocks (B) are formed between the spherical domains of the first polymer blocks (A) into a polymer matrix format. Meanwhile, when the volume fraction $\phi$ of the first polymer blocks (A) increases, the first and second polymer blocks (A) and (B) form domains in a reverse manner as described above.

Exemplary Embodiment

FIGS. 2A through 2E are plan views for explaining a method of fabricating a semiconductor device according to an exemplary embodiment of the present invention. FIGS. 3A, 4A, 5A, 6A, and 7A are sectional views taken along lines I-I' of FIGS. 2A through 2E, respectively, according to an exemplary embodiment of the present invention. FIGS. 3B, 4B, 5B, 6B, and 7B are sectional views taken along lines II-II' of FIGS. 2A through 2E, respectively, according to an exemplary embodiment of the present invention.

Figure 2A:
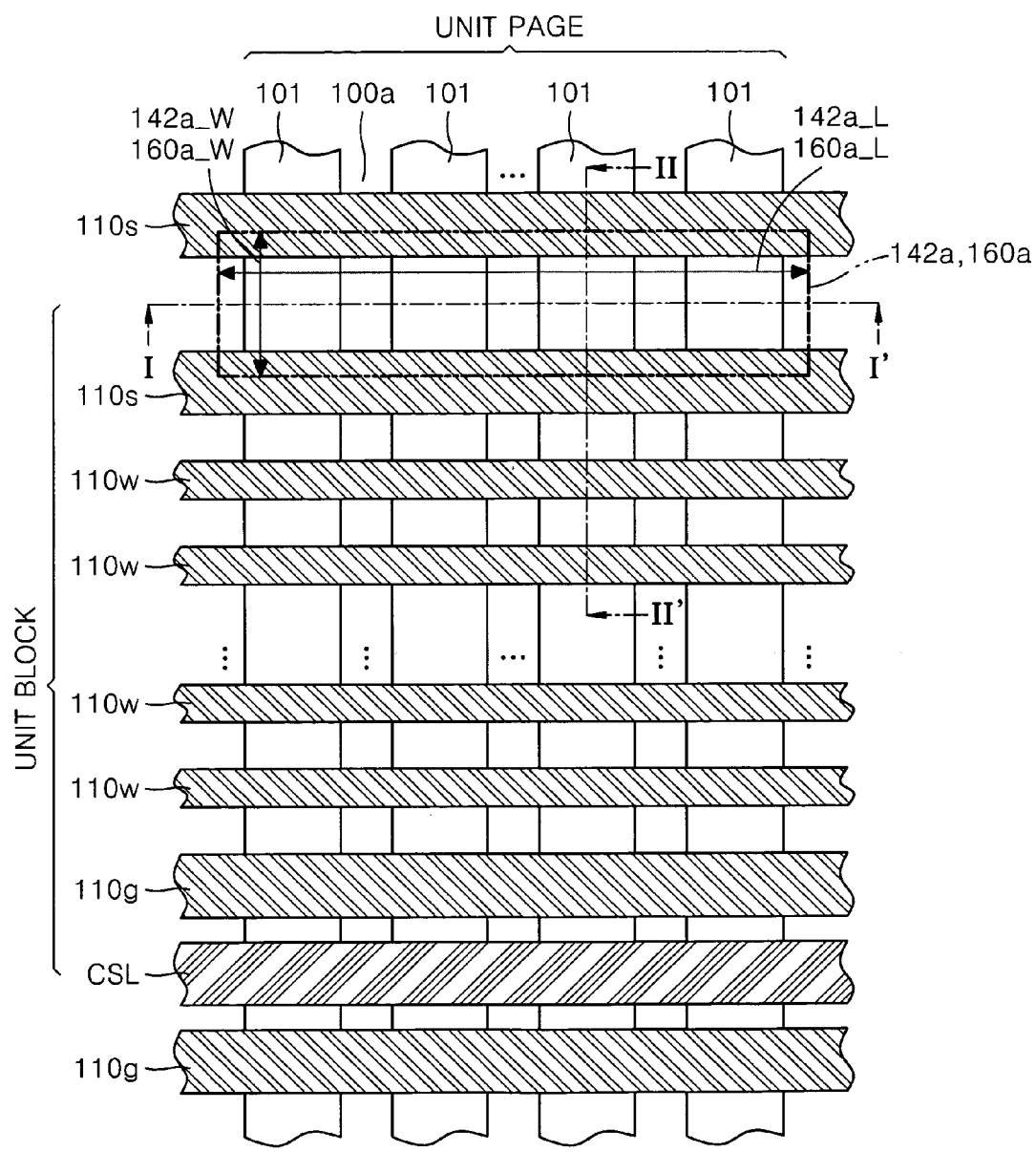
FIGS. 2A through 2E are plan views for explaining a method of fabricating a semiconductor device according to an exemplary embodiment of the present invention.
Figure 3A:
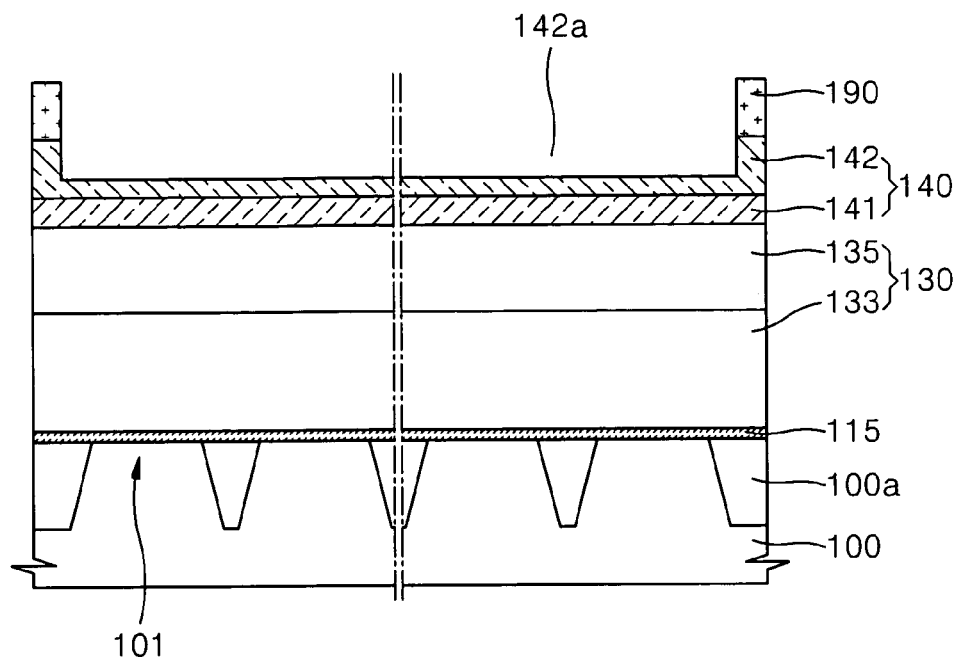
FIGS. 3A, 4A, 5A, 6A, and 7A are sectional views taken along lines I-I' of FIGS. 2A through 2E, respectively, according to an exemplary embodiment of the present invention.
Figure 3B:
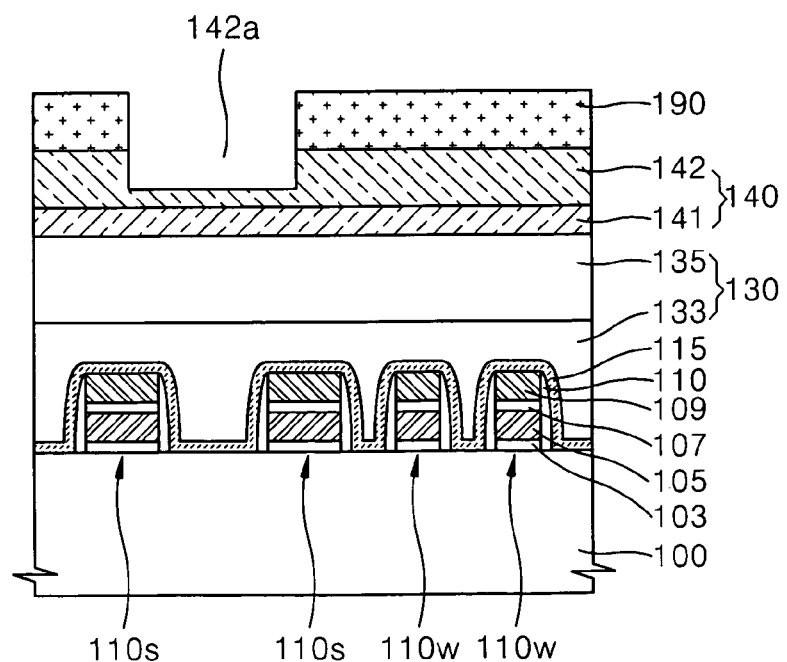
FIGS. 3B, 4B, 5B, 6B, and 7B are sectional views taken along lines II-II' of FIGS. 2A through 2E, respectively, according to an exemplary embodiment of the present invention.

Referring to FIGS. 2A, 3A, and 3B, a plurality of lower patterns is formed on a substrate 100. For example, device isolation regions 100a are formed in the substrate 100 to define a plurality of parallel active regions 101 having a line shape. The device isolation regions 100a can be formed using a general trench isolation technique.

Gate lines 110s, 110w, and 110g are formed on the active regions 101. The gate lines 110s, 110w, and 110g cross the active regions 101. Each of the gate lines 110s, 110w, and 110g may have a stacked structure formed by a gate dielectric layer 103, a floating gate 105, an inter-gate dielectric layer 107, and control gate 109. The floating gate 105 may be, for example, a polysilicon layer. The inter-gate dielectric layer 107 may be a high-k dielectric layer. For example, the inter-gate dielectric layer 107 may be a silicon oxide/silicon nitride/silicon oxide (ONO) layer. The control gate 109 may be, for example, a polysilicon layer or a stacked layer formed of a polysilicon layer and a metal silicide layer. The metal silicide layer may be, for example, a tungsten silicide layer, cobalt silicide layer, or nickel silicide layer.

The gate lines 110s, 110w, and 110g may includes a plurality of word lines 110w, a string section line (SSL) 110s formed at one side of the word lines 110w, and a ground selection line (GSL) 110g formed at the other side of the word lines 110w. Impurity regions are formed in the active regions 101 at both sides of the gate lines 110s, 110w, and 110g. As a result, in a given active region 101, a string selection transistor, cell transistors, and a ground selection transistor are formed in series. The string selection transistor, the cell transistors, and the ground selection transistor make up a unit block.

Portions of the active regions 101 that are located at one side of the string selection line 110s away from the ground selection line 110g may be drain regions of string selection transistors. In other words, portions of the active regions 101 that are disposed between string selection lines 110s of neighboring unit blocks may be formed into drain regions of string selection transistors. Further, portions of the active regions 101 that are located at one side of the ground selection line 110g away from the string selection line 110s (e.g., portions of the active regions 101 that are located between ground selection lines 110g of neighboring unit blocks) may be source regions of ground selection transistors.

A spacer insulation layer can be formed on the gate lines 110s, 110w, and 110g and etched back so as to form insulation spacers 110 covering sidewalls of the gage lines 110s, 110w, and 110g. Next, an etch stop layer 115 can be formed on the substrate 100 including the insulation spacers 110. The etch stop layer 115 nay be, for example, a silicon nitride layer or silicon oxynitride layer.

A lower interlayer insulation layer 133 can be formed on the substrate 100 including the etch stop layer 115. The lower interlayer insulation layer 133 may be, for example, a high density plasma (HDP) oxide layer, an undoped silicate glass (USG) layer, a plasma enhanced tetra ethyl ortho silicate (PE-TEOS) layer, or a plasma enhanced oxy-silane (PE-OxSi) layer.

A common source line trench is formed in the lower interlayer insulation layer 133 to expose the source regions of the ground selection transistors. Here, butting contact holes can be formed to expose the floating gates 105 of the string selection line 110s and the ground selection line 110g, respectively. Next, a conductive layer is formed in the common source line trench and the butting contact holes, and then a planarization process is formed to form a common source fine (CSL) and butting contact holes. The CSL can be parallel with the gate lines 110s, 110w, and 110g.

An upper interlayer insulation layer 135 is formed on the CSL and the lower interlayer insulation layer 133. The upper interlayer insulation layer 135 may be, for example, a PE-TEOS layer or a PE-OxSi layer.

A self-assemble induction layer 140 is formed on the upper interlayer insulation layer 135. A recess 142a is formed in the self-assemble induction layer 140. The recess 142a is aligned with lower patterns (e.g., the active regions 101 and/or the gate lines 110s, 110w, and 110g). The recess 142a can be formed as follows: a photoresist layer is formed on the self-assemble induction layer 140; a photoresist pattern 190 is formed by exposing and developing the photoresist layer; and the self-assemble induction layer 140 is partially etched using the photoresist pattern 190 as a mask. Therefore, the self-assemble induction layer 140 can remain at a bottom of the recess 142a. In this case, the bottom and sidewalls of the recess 142a can be formed of the same material layer. In an exemplary embodiment of the present invention, the recess 142a may have a depth of about 50 nm to about 500 nanometers (nm) in consideration of the etch selectivity of the self-assemble induction layer 140 to block copolymer layer to be formed.

In an exemplary embodiment of the present invention, the recess 142a can cross a plurality of lower patterns (e.g., the active regions 101). Further, the recess 142a can be parallel with the gate lines 110s, 110w, and 110g. For example, the recess 142a can cross portions of the active regions 101 located between the gate lines 110s, 110w, and 110g (e.g., between the string selection lines 110s). Here, the recess 142a may cross a group of the active regions 101 arranged at a constant pitch. For example, the recess 142a may cross all the active regions 101 included in a unit page.

In an exemplary embodiment of the present invention, the self-assemble induction layer 140 may be a hard mask layer. The hard mask layer may include a first hard mask layer 141 and a second hard mask layer 142 that are sequentially stacked. In this case, the recess 142a can be formed in the second hard mask layer 142. The first hard mask layer 141 can be, for example, an amorphous carbon layer (ACL), and the second hard mask layer 142 can be, for example, a silicon nitride layer, a silicon oxynitride layer, a silicon carbide layer, or an amorphous silicon layer. Here, the amorphous carbon layer 141 has a high etch selectivity to the lower and upper interlayer insulation layer 133 and 135 (Hereinafter, the lower and upper insulation layers 133 and 135 will be referred to an interlayer insulation layer 130), such that a contact hole having a good profile can be formed in the interlayer insulation layer 130. However, the amorphous carbon layer 141 can be removed when the photoresist pattern 190 is removed using oxygen plasma. Thus, the second hard mask layer 142 is formed on the amorphous carbon layer 141 to protect the amorphous carbon layer 141 from the oxygen plasma.

Figure 2B:
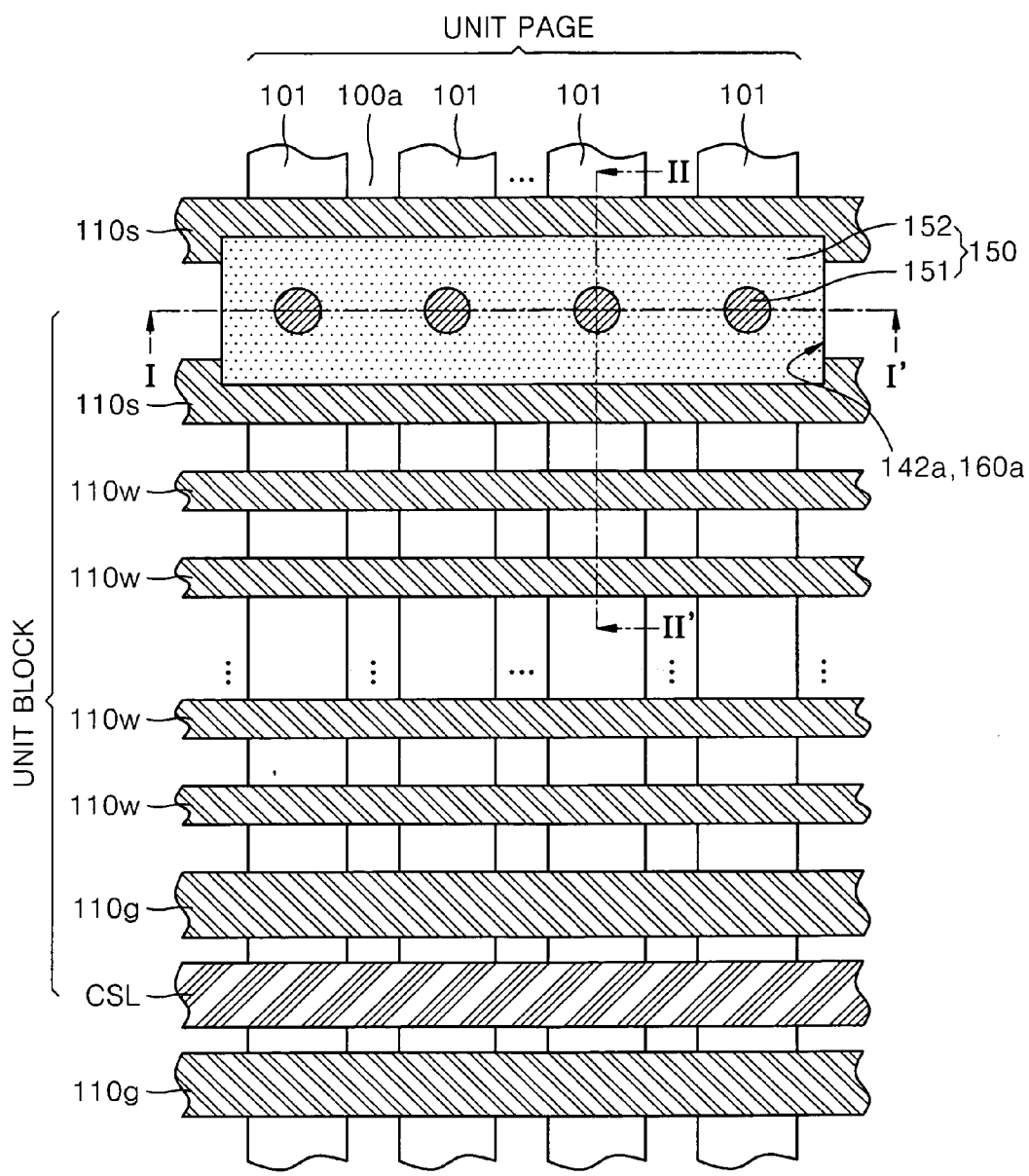
Figure 4A:
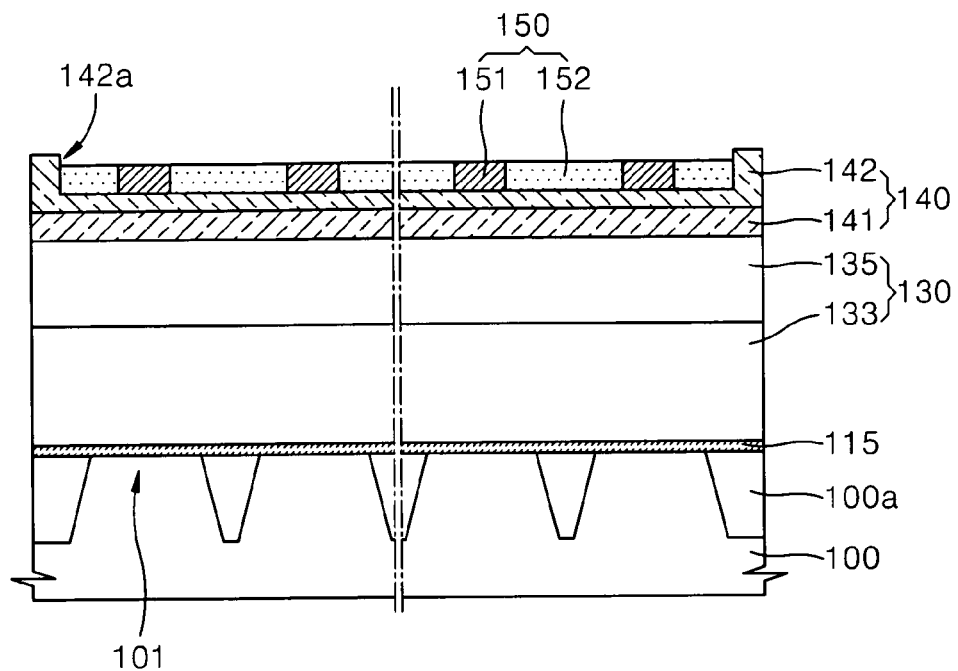
Figure 4B:
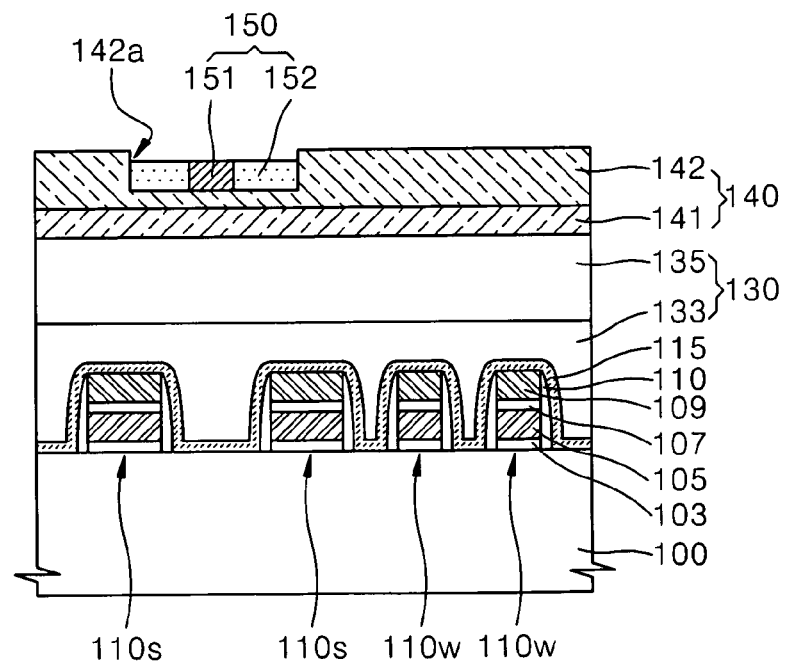

Referring to FIGS. 2B, 4A, and 4B, a block copolymer layer 150 is formed in the recess 142a. The block copolymer layer 150 can be formed by spin coating. As described in FIGS. 1A through 1C, the block copolymer layer 150 includes block copolymers each having a first polymer block and a second polymer block. The block copolymer may be, for example, PS (polystyrene)-PI (polyimide), PS (polystyrene)-PB (polybutene), PS (polystyrene)-PMMA (Poly(methyl methacrylate)), PEP-PEE (poly(ethylenepropylene)-poly(ethylethylene)), PE (polyethylene)-PEE (poly(ethylethylene)), or PS (polystyrene)-PDMS (Polydimethylsiloxane).

The substrate 100 formed with the block copolymer layer 150 is annealed at a predetermined temperature. The annealing may be performed at a relatively low temperature compared to the temperature at which the block copolymer layer 150 is formed. As a result, the block copolymers of the block copolymer layer 150 are self-assembled into a nanostructure. For example, in the block copolymer layer 150, the first polymer blocks form a plurality of polymer domains 151, and the second polymer blocks form a polymer matrix 152 surrounding the polymer domains 151.

Here, the self-assembling of the block copolymers are initiated from the sidewalls of the recess 142a. For example, the polymer matrix 152 contacts the sidewalls of the recess 142a, and the polymer domains 151 are spaced a predetermined distance from the sidewalls of the recess 142a by the polymer matrix 152. Further, the polymer domains 151 are uniformly arranged in the recesses 142a. The molecular weight of the polymer blocks (e.g., the second polymer blocks) forming the polymer matrix 152 may determine the distance between the polymer domain 151 and the sidewall of the recess 142a and the distance between the polymer domains 151. Further, the molecular weight of the polymer blocks (e.g., the first polymer blocks) forming the polymer domains 151 may determine the diameter of the polymer domains 151. Therefore, the polymer domains 151 can be respectively aligned with the active regions 101 by adjusting the molecular weights of the first and second polymer blocks.

Figure 8A:
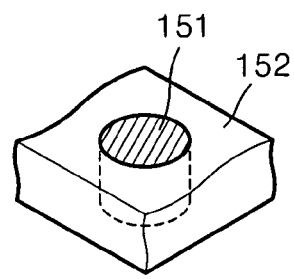
FIGS. 8A through 8C are perspective views illustrating shapes of polymer domains formed according to exemplary embodiments of the present invention.
Figure 8B:
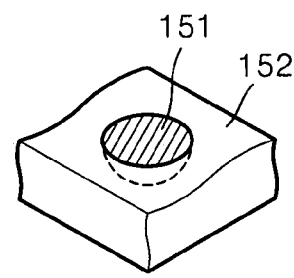
Figure 8C:
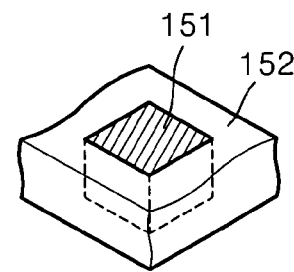

Meanwhile, as described in FIG. 1C, the shape of the polymer domains 151 varies with the volume fraction φ of the first polymer blocks making up the polymer domains 151. For example, the polymer domains 151 can be formed into a cylindrical shape (refer to FIG. 8A), a semi-spherical shape (refer to FIG. 8B), or a rectangular box shape (refer to FIG. 8C). In an exemplary embodiment of the present invention, when the bock copolymer layer 150 is formed of PS-PMMA, the polymer domains 151 can be formed into a semi-spherical shape (refer to FIG. 8B) by adjusting the volume fraction φ of PMMA to 0.3.

Figure 2C:
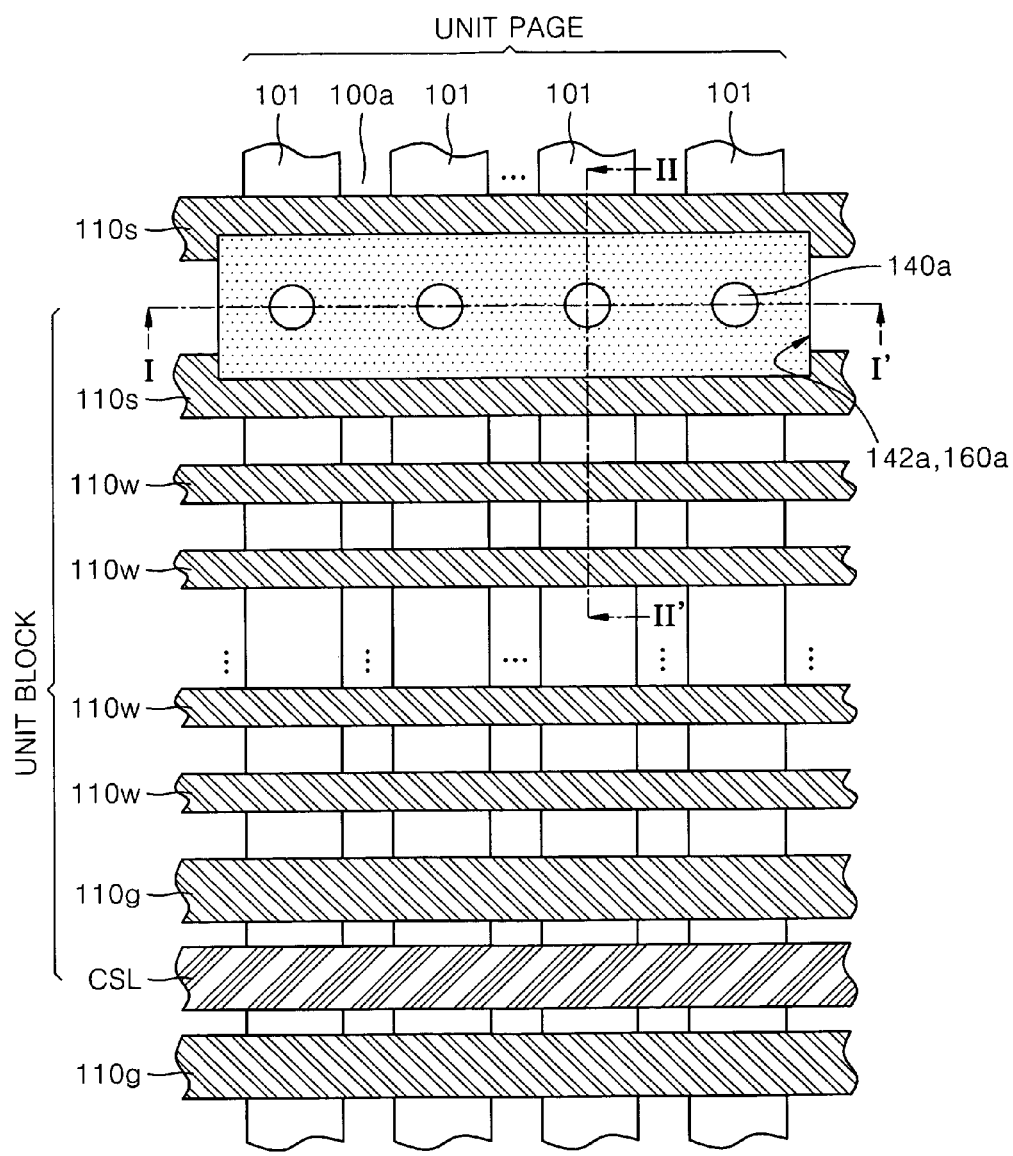
Figure 5A:
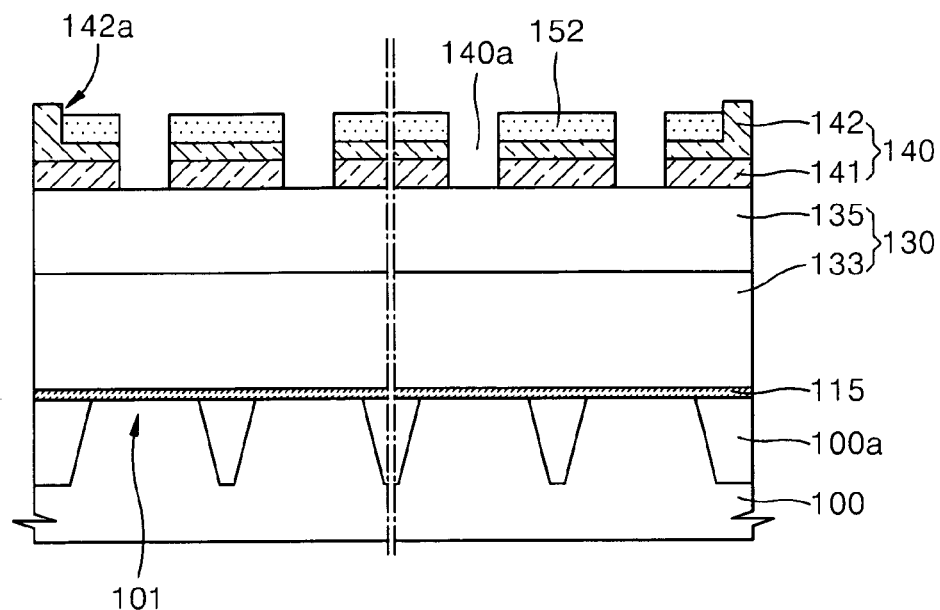
Figure 5B:
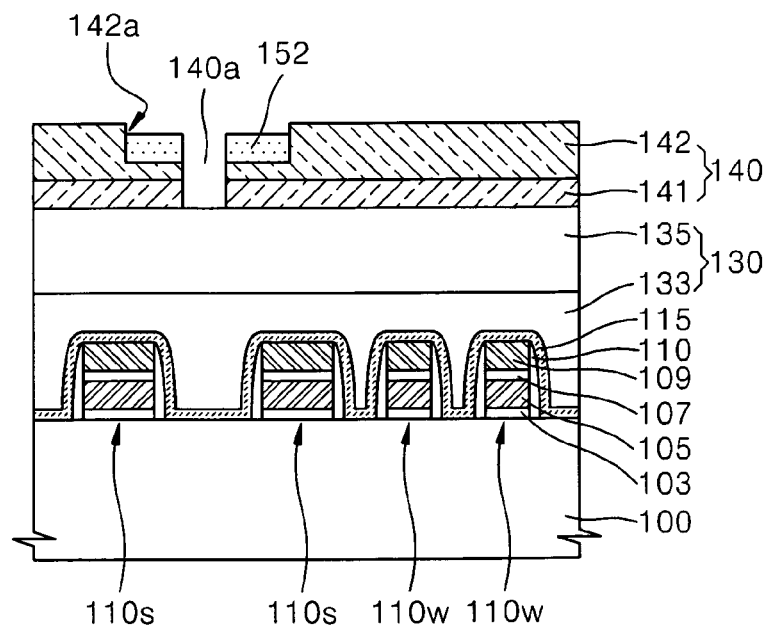

Referring to FIGS. 2C, 5A, and 5B, the polymer domains 151 are removed to expose the bottom of the recess 142a (e.g, the second hard mask layer 142). Here, the polymer matrix 152 remains in the recess 142a. The removal of the polymer domains 151 can be performed by wet etching, oxygen plasma etching, or Ultra-violet irradiation according to the characteristics of the polymer domains 151 and the polymer matrix 152. Meanwhile, when the first hard mask layer 141 is formed of an amorphous carbon layer (e.g., organic layer), the first hard mask layer 141 can be damaged when the polymer domains 151 are removed. Thus, the second hard mask layer 142 (e.g. inorganic layer) is formed to protect the first hard mask layer 141.

The self-assemble induction layer (e.g., hard mask layer) 140 is etched using the polymer matrix 152 as a mask to form openings 140a, thereby exposing the interlayer insulation layer 130 (e.g., the upper interlayer insulation layer 135). For example, the self-assemble induction layer 140 is etched as follows: the second hard mask layer 142 is etched, and then the first hard mask layer 141 is etched using the etched second hard mask layer 142 as a mask.

Figure 2D:
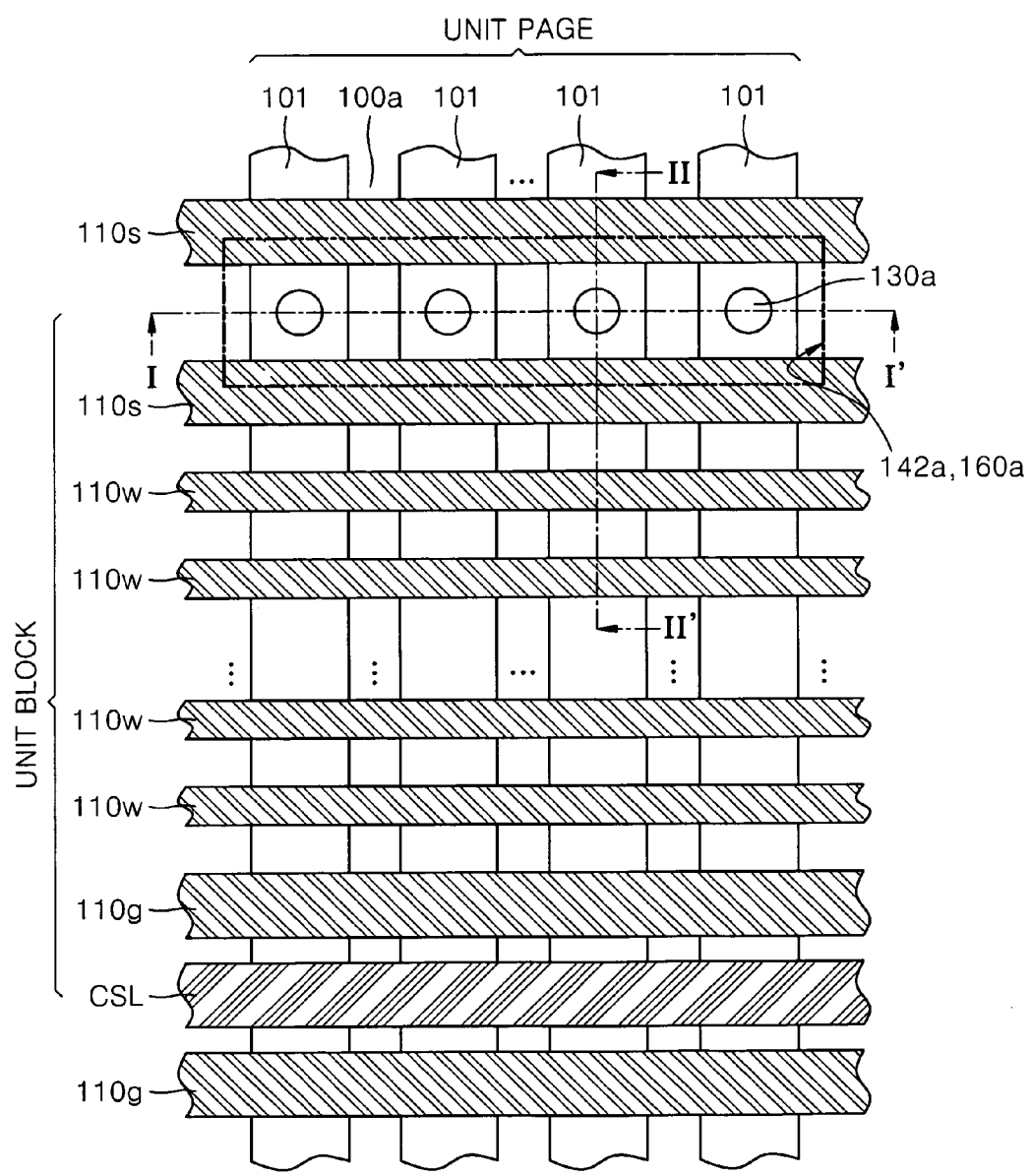
Figure 6A:
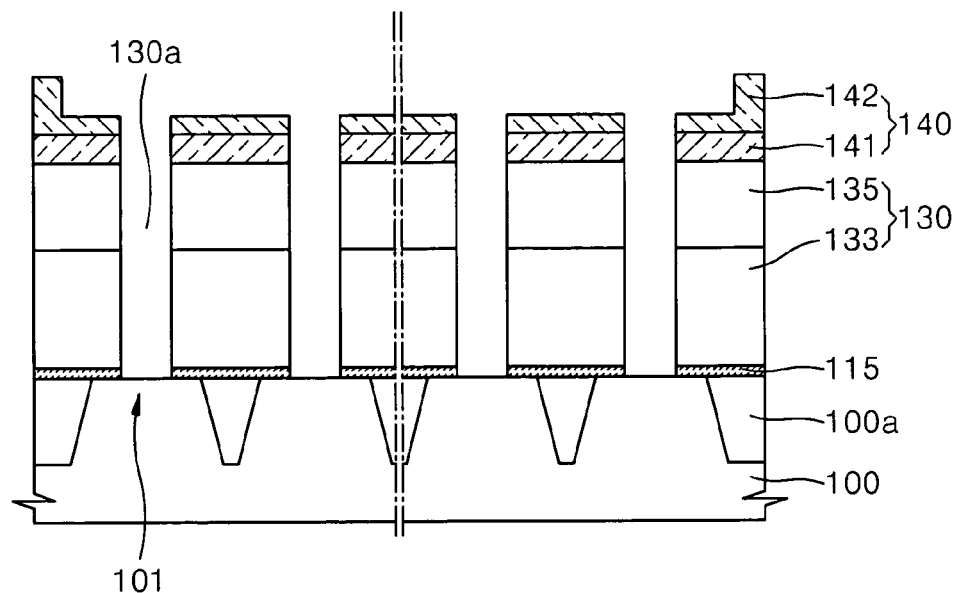
Figure 6B:
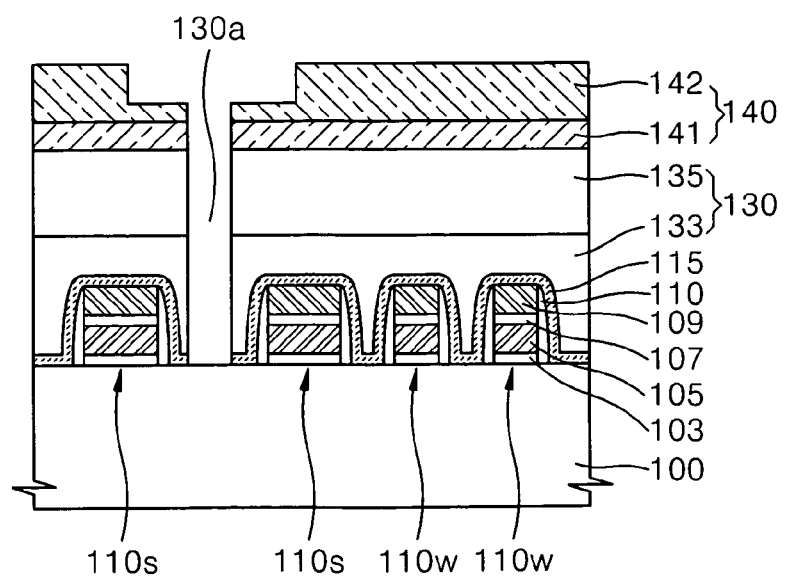

Referring to FIGS. 2D, 6A, and 6B, the polymer matrix 152 can be removed during or after the etching of the self-assemble induction layer 140 to expose the self-assemble induction layer 140 where the recess 142a is formed. The interlayer insulation layer 130 exposed in the openings 140a and the etch stop layer 115 formed below the interlayer insulation layer 130 are etched using the self-assemble induction layer (e.g., hard mask layer) 140 as a mask so as to form contact holes 130a. Portions of the active regions 101 (e.g., the drain regions of the string selection transistors) are exposed by the contact holes 130a. The contact holes 130a may be bit line contact holes.

Figure 2E:
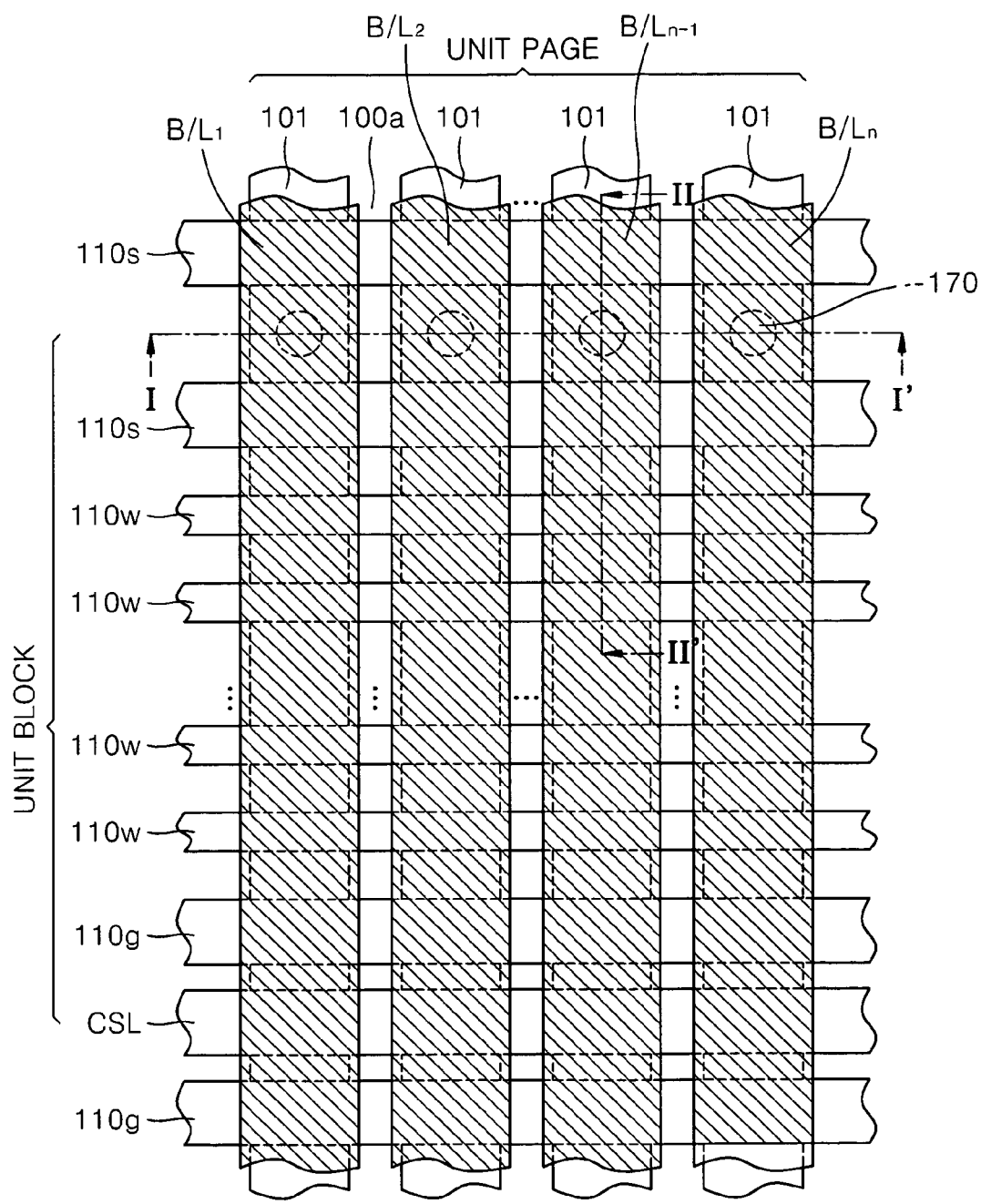
Figure 7A:
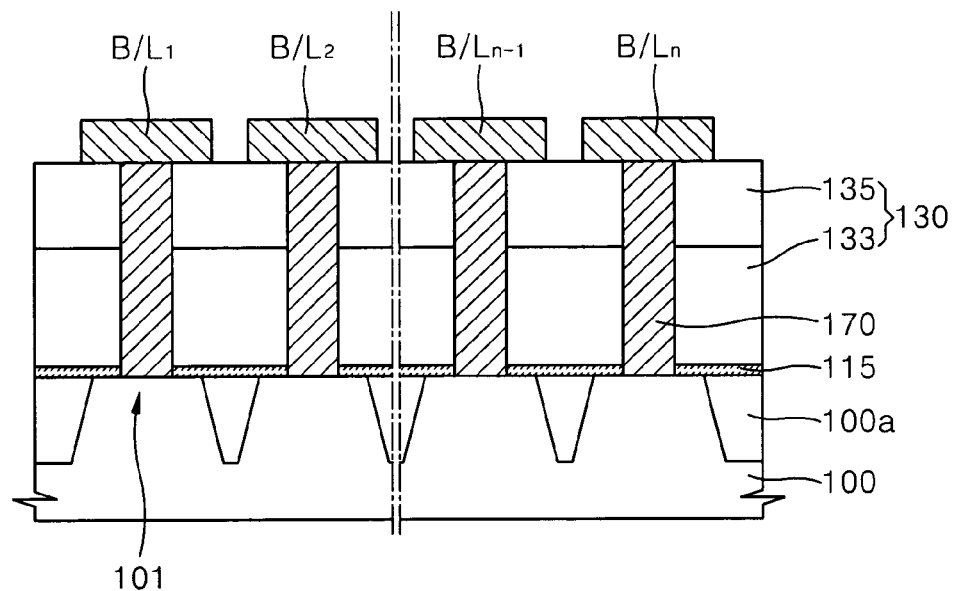
Figure 7B:
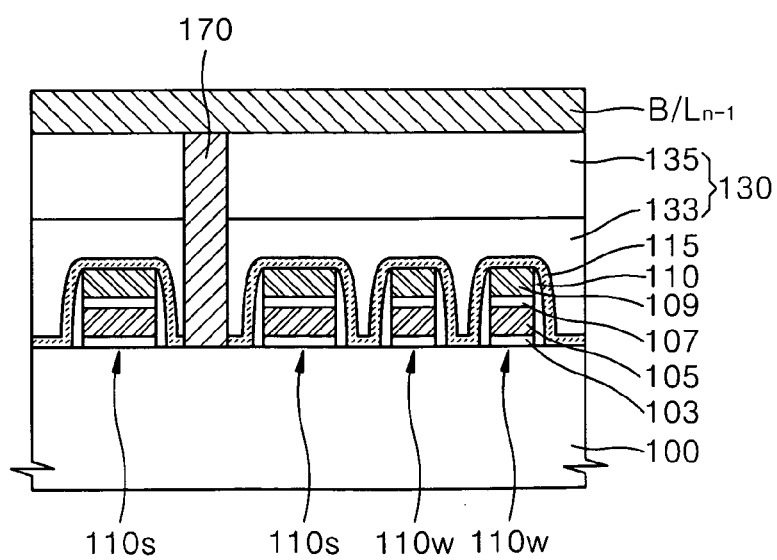

Referring to FIGS. 2E, 7A, and 7B, the self-assemble induction layer (e.g. hard mask layer) 140 is removed to expose the upper interlayer insulation layer 135.

A conductive layer is formed on the exposed upper interlayer insulation layer 135 to fill the bit line contact holes 130a, and then planarization process is performed until a top surface of the upper interlayer insulation layer 135 is exposed, thereby forming bit line contact plugs 170. Next, a conductive layer is formed on the bit line contact plugs 170 and the upper interlayer insulation layer 135. Then, the conductive layer is patterned to form bit lines B/L$_1$, B/L$_2$, B/L$_3$, through to B/L$_n$ that make contact with the bit line contact plugs 170 one by one. The bit lines B/L$_1$, B/L$_2$, B/L$_3$, through to B/L$_n$ may be parallel with the active region 101 and cross the gate lines 110s, 110w, and 110g.

Another Exemplary Embodiment

FIGS. 9A, 10A, 11A and 12A are sectional views taken along lines I-I' of FIGS. 2A through 2D, respectively, according to another exemplary embodiment of the present invention, and FIGS. 9B, 10B, 11B and 12B are sectional views taken along lines II-II' of FIGS. 2A through 2D, respectively, according to another embodiment of the present invention. A method of forming a semiconductor device will now be described with reference to the accompanying drawings according to another exemplary embodiment of the present invention. The current exemplary embodiment is similar to the previous exemplary embodiment. Thus, the current exemplary embodiment will now be described, concentrating on the difference from the previous exemplary embodiment.

Figure 9A:
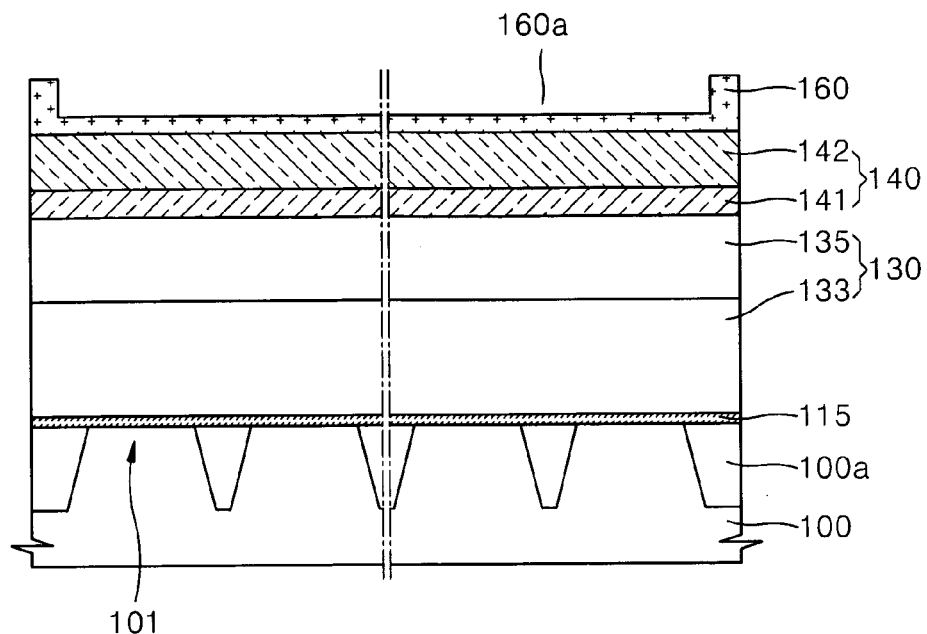
FIGS. 9A, 10A, 11A and 12A are sectional views taken along lines I-I' of FIGS. 2A through 2D, respectively, according to an exemplary embodiment of the present invention.
Figure 9B:
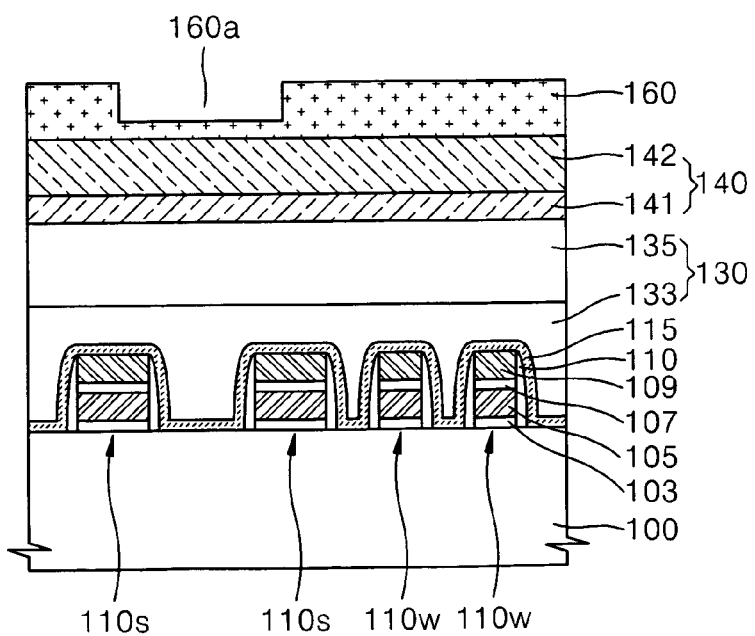
FIGS. 9B, 10B, 11B and 12B are sectional views taken along lines II-II' of FIGS. 2A through 2D, respectively, according to an exemplary embodiment of the present invention.

Referring to FIGS. 2A, 9A, and 9B, in the same way as described in FIGS. 3A and 3B, device isolation regions 100a are formed in the substrate 100 to define a plurality of parallel active regions 101 having a line shape. Then, gate lines 110s, 110w, and 110g crossing the active regions 101, insulation spacers 110, an etch stop layer 115, a lower interlayer insulation layer 133, a CSL, and butting contact plugs are formed.

An upper interlayer insulation layer 135 is formed on the CSL and the lower interlayer insulation layer 133. A self-assemble induction layer 160 is formed on the upper interlayer insulation layer 135. The self-assemble induction layer 160 can be a photoresist layer.

Before forming the photoresist layer 160, a hard mask layer 140 can be formed on the upper interlayer insulation layer 135. The hard mask layer 140 can include a first hard mask layer 141 and a second hard mask layer that are sequentially stacked. The first hard mask layer 141 can be, for example, an amorphous carbon layer (ACL), and the second hard mask layer 142 can be, for example, a silicon nitride layer, a silicon oxynitride layer, a silicon carbide layer, or an amorphous silicon layer.

A recess 160a is formed in the photoresist layer 160. The recess 160 is aligned with the active regions 101 and/or the gate lines 110s, 110w, and 110g. The recess 160a is formed by exposing and developing the photoresist layer 160. The recess 160a is formed such that the photoresist 160 remains at a bottom of the recess 160a. When the self-assemble induction layer 160 is formed of photoresist as described above, align errors can be easily corrected. For example, when the recess 160a is not properly aligned with lower patterns, the existing photoresist layer 160 can be easily removed without damaging lower layers, and then a new photoresist layer 160 and a recess 160a can be formed. Here, the photoresist layer 160 may be formed of Si-containing photoresist.

In an exemplary embodiment of the present invention, the recess 160a can cross two or more of the active regions 101. Further, the recess 160a can be parallel with the gate lines 110s, 110w, and 110g. For example, the recess 160a can cross portions of the active regions 101 located between the gate lines 110s, 110w, and 110g (e.g., between the string selection lines 110s). Here, the recess 160a may cross a group of the active regions 101 arranged at a constant pitch. For example, the recess 160a may cross all the active regions 101 included in a unit page.

Figure 10A:
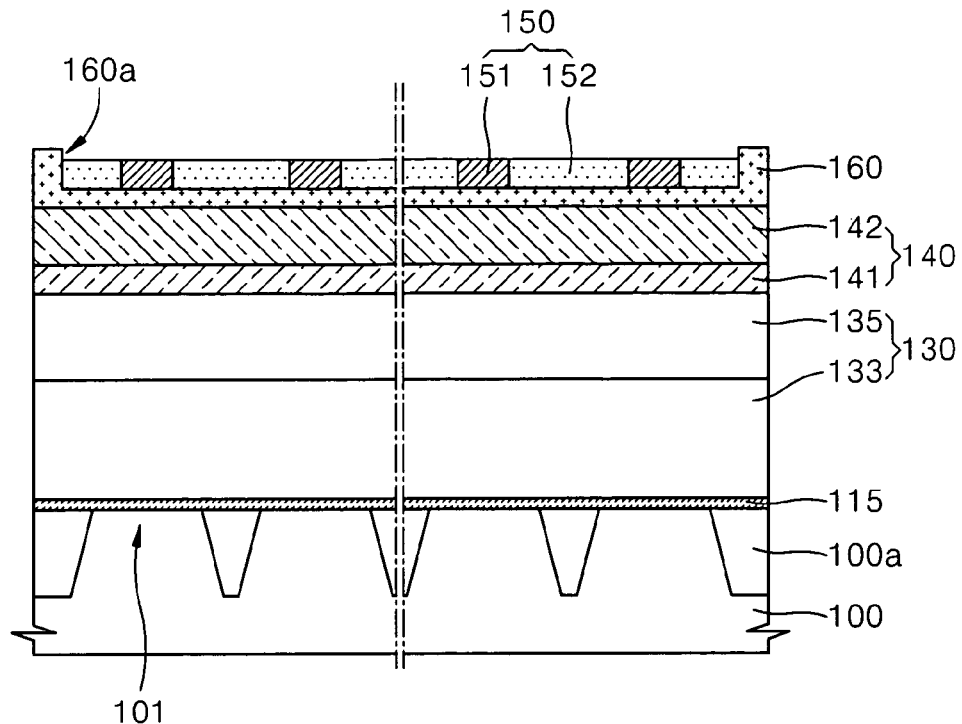
Figure 10B:
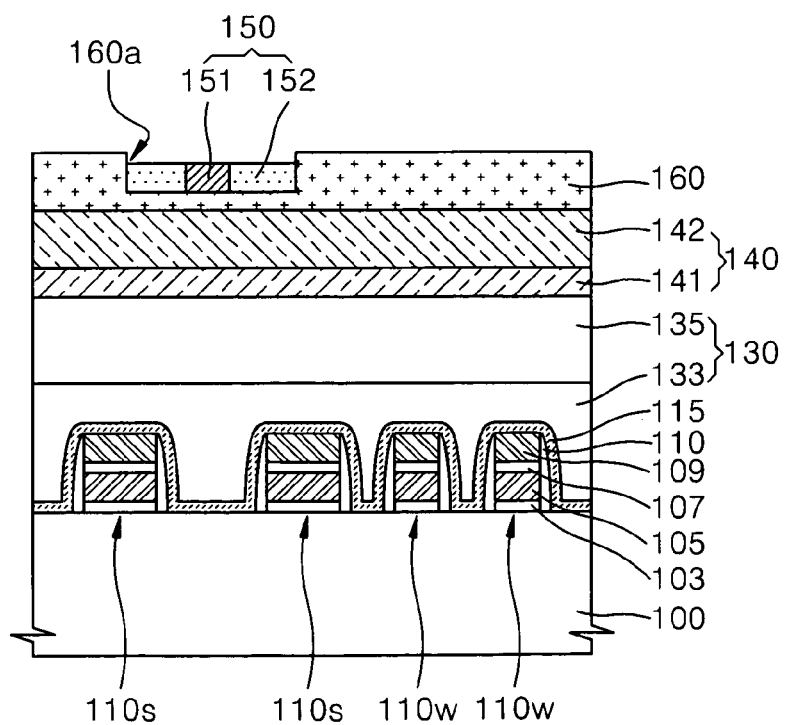

Referring to FIGS. 2B, 10A, and 10B, a block copolymer layer 150 is formed in the recess 160a. The substrate 100 formed with the block copolymer layer 150 is annealed at a predetermined temperature. As a result, block copolymers of the block copolymer layer 150 are self-assembled into a nanostructure. For example, in the block copolymer layer 150, first polymer blocks form a plurality of polymer domains 151, and second polymer blocks form a polymer matrix 152 surrounding the polymer domains 151.

Here, the self-assembling of the block copolymers are initiated from sidewalls of the recess 160a. For example, the polymer matrix 152 contacts the sidewalls of the recess 160a, and the polymer domains 151 are spaced a predetermined distance from the sidewalls of the recess 160a by the polymer matrix 152. Further, the polymer domains 151 are uniformly arranged in the recesses 160a. The molecular weight of the polymer blocks (e.g., the second polymer blocks) forming the polymer matrix 152 may determine the distance between the polymer domain 151 and the sidewall of the recess 160a and the distance between the polymer domains 151. Further, the molecular weight of the polymer blocks (e.g., the first polymer blocks) forming the polymer domains 151 may determine the diameter of the polymer domains 151. Therefore, the polymer domains 151 can be respectively aligned with the active regions 101 by adjusting the molecular weights of the first and second polymer blocks.

Figure 11A:
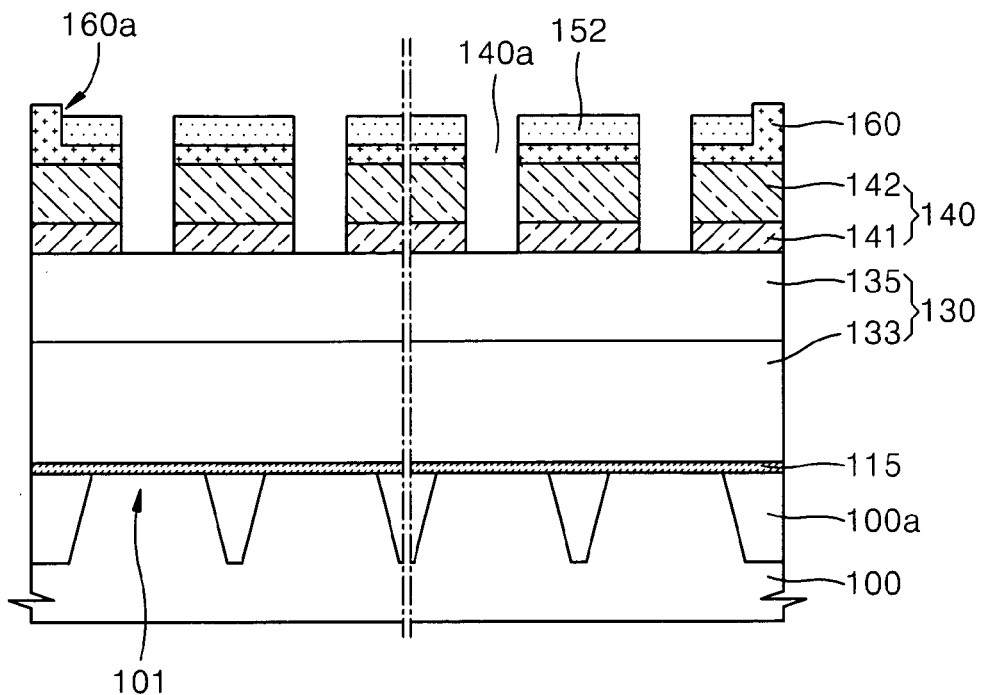
Figure 11B:
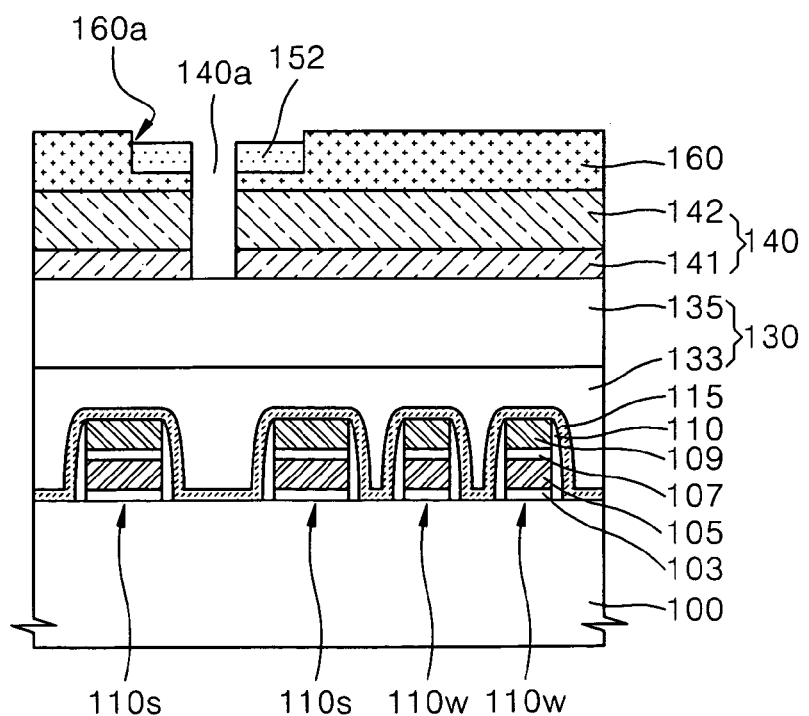

Referring to FIGS. 2C, 11A, and 11B, the polymer domains 151 are removed to expose the bottom of the recess 160a (e.g., the photoresist layer 160). Here, the polymer matrix 152 remains in the recess 160a. The removal of the polymer domains 151 can be performed by wet etching, oxygen plasma etching, or ultra-violet irradiation according to the characteristics of the polymer domains 151, the polymer matrix 152, and the photoresist layer 160. Meanwhile, when the photoresist layer 160 is formed of Si-containing photoresist, the photoresist layer 160 may be not damaged when the polymer domains 152 are removed.

Portions of the photoresist layer 160 and the hard mask layer 140 located at the bottom of the recess 160a are etched using the polymer matrix 152 as a mask to form openings 140a, thereby exposing the upper interlayer insulation layer 135. The polymer matrix 152 and the photoresist layer 160 can be removed after the etching of the hard mask layer 140.

Figure 12A:
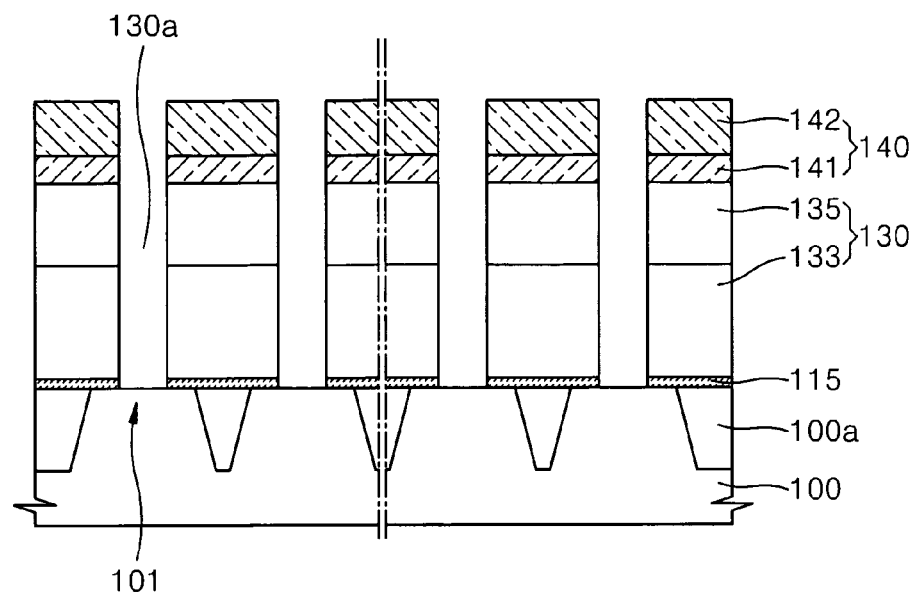
Figure 12B:
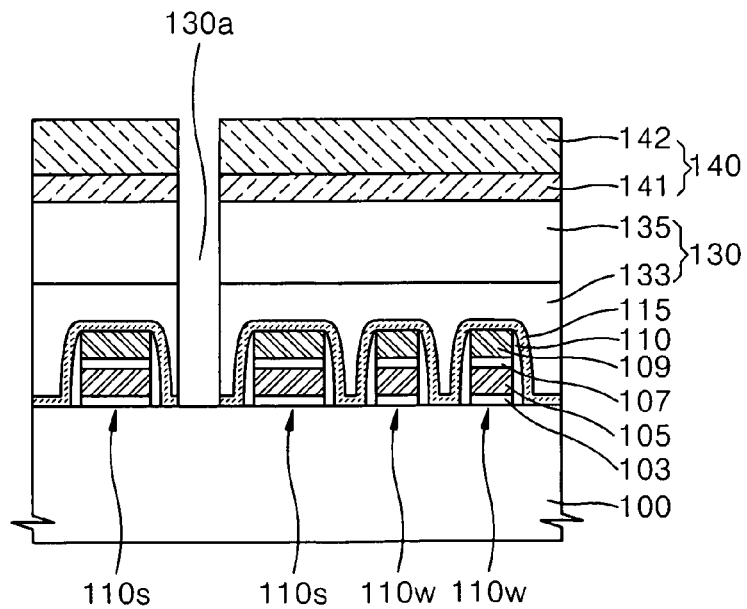

Referring to FIGS. 2D, 12A, and 12B, the interlayer insulation layer 130 exposed by the openings 140a and the etch stop layer 115 formed below the interlayer insulation layer 130 are etched using the hard mask layer 140 as a mask so as to form contact holes 130a. Portions of the active regions 101 (e.g., the drain regions of the string selection transistors) are exposed by the contact holes 130a. The contact holes 130a may be bit line contact holes.

As described above, according to the exemplary embodiments of the present invention, the self-assemble induction layer is formed on the interlayer insulation layer, and the recess is formed in the self-assemble induction layer in alignment with a lower pattern (e.g., the active regions). Then, the block copolymer layer is formed in the recess. Therefore, the polymer domains of the block copolymer layer can be self-assembled in alignment with the respective active regions. Accordingly, the contact holes can be formed in the interlayer insulation layer in alignment with the respective active regions.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming a contact hole, comprising:
forming a plurality of lower patterns on a substrate;
forming an insulation layer on the lower patterns;
forming a self-assemble induction layer on the insulation layer;
forming a recess in the self-assemble induction layer in alignment with the lower patterns;
forming a block copolymer layer in the recess to form a polymer domain at a distance from a sidewall of the recess and a polymer matrix surrounding the polymer domain;
removing the polymer domain;
etching the self-assemble induction layer using the polymer matrix as a mask to form an opening through the self-assemble induction layer to expose the insulation layer;
removing the polymer matrix during or after the etching of the self-assemble induction layer; and
etching the insulation layer exposed by the opening by using the self-assemble induction layer as a mask so as to form a contact hole.

2. The method of claim 1, wherein the recess crosses two or more of the lower patterns, and a plurality of polymer domains is formed when the block copolymer layer is formed, wherein the polymer domains are spaced apart from each other by the polymer matrix and are aligned with the respective lower patterns over which the recess crosses.

3. The method of claim 1, wherein the polymer domain has one of a semi-spherical shape, a cylindrical shape, or a hexahedral shape.

4. The method of claim 1, wherein the self-assemble induction layer is a hard mask layer.

5. The method of claim 4, wherein the hard mask layer comprises a first hard mask layer and a second hard mask layer that are stacked, and the recess is formed in the second hard mask layer.

6. The method of claim 5, wherein the first hard mask layer is an ACL (amorphous carbon layer), and the second hard mask layer is one of a silicon nitride layer, a silicon oxynitride layer, a silicon carbide layer, or an amorphous silicon layer.

7. The method of claim 1, wherein the self-assemble induction layer is a photoresist layer.

8. The method of claim 7, further comprising forming a hard mask layer on the insulation layer prior to the forming of the photoresist layer.

9. The method of claim 8, wherein the hard mask layer comprises a first hard mask layer and a second hard mask layer that are stacked, wherein the first hard mask layer is an ACL (amorphous carbon layer), and the second hard mask layer is one of a silicon nitride layer, a silicon oxynitride layer, a silicon carbide layer, or an amorphous silicon layer.

10. A method of fabricating a semiconductor device, comprising:
forming a device isolation region on a substrate to define a plurality of parallel active regions;
forming an insulation layer on the active regions;
forming a self-assemble induction layer on the insulation layer;
forming a recess in the self-assemble induction layer, the recess being aligned with the active regions and crossing the active regions;
forming a block copolymer layer in the recess to form a plurality of polymer domains at a distance from a sidewall of the recess and a polymer matrix surrounding the polymer domains, the polymer domains being spaced apart from each other by the polymer matrix and aligned with the respective active regions over which the recess crosses;
removing the polymer domains;
etching the self-assemble induction layer using the polymer matrix as a mask to form a plurality of openings through the self-assemble induction layer to expose the insulation layer;
removing the polymer matrix during or after the etching of the self-assemble induction layer; and
etching the insulation layer exposed by the opening by using the self-assemble induction layer as a mask so as to form a plurality of contact holes.

11. The method of claim 10, further comprising forming a plurality of parallel gate lines across the active regions prior to the forming of the insulation layer, wherein the recess crosses portions of the active regions located between the gate lines.

12. The method of claim 11, wherein the gate lines comprise a plurality of string selection lines, a plurality of ground selection lines, and a plurality of word lines formed between a pair of the string selection line and the ground selection line, wherein the recess crosses portions of the active regions located between the string selection lines.

13. The method of claim 10, wherein the polymer domains have one of a semi-spherical shape, a cylindrical shape, or a hexahedral shape.

14. The method of claim 10, wherein the self-assemble induction layer is a hard mask layer.

15. The method of claim 14, wherein the hard mask layer comprises a first hard mask layer and a second hard mask layer that are stacked, and the recess is formed in the second hard mask layer.

16. The method of claim 15, wherein the first hard mask layer is an ACL (amorphous carbon layer), and the second hard mask layer is one of a silicon nitride layer, a silicon oxynitride layer, a silicon carbide layer, or an amorphous silicon layer.

17. The method of claim 10, wherein the self-assemble induction layer is a photoresist layer.

18. The method of claim 17, further comprising forming a hard mask layer on the insulation layer prior to the forming of the photoresist layer.

19. The method of claim 18, wherein the hard mask layer comprises a first hard mask layer and a second hard mask layer that are stacked, wherein the first hard mask layer is an ACL (amorphous carbon layer), and the second hard mask layer is one of a silicon nitride layer, a silicon oxynitride layer, a silicon carbide layer, or an amorphous silicon layer.

* * * * *